US 6,690,993 B2

(12) United States Patent
Foulke et al.

(10) Patent No.: US 6,690,993 B2
(45) Date of Patent: Feb. 10, 2004

(54) RETICLE STORAGE SYSTEM

(75) Inventors: Richard F. Foulke, Stoneham, MA (US); Richard F. Foulke, Jr., Hampstead, NH (US); Cord W. Ohlenbusch, Andover, MA (US); Takman Lui, Andover, MA (US)

(73) Assignee: R. Foulke Development Company, LLC, Salem, NH (US)

( * ) Notice: Subject to any disclaimer, the term of this patent is extended or adjusted under 35 U.S.C. 154(b) by 0 days.

(21) Appl. No.: 09/892,945

(22) Filed: Jun. 27, 2001

(65) Prior Publication Data

US 2002/0044856 A1 Apr. 18, 2002

Related U.S. Application Data

(60) Provisional application No. 60/239,654, filed on Oct. 12, 2000.

(51) Int. Cl.$^7$ ................................................ G06F 7/00
(52) U.S. Cl. .................. 700/218; 700/259; 414/217; 414/217.1; 414/277; 414/937; 414/938; 414/939
(58) Field of Search ................. 700/213, 214, 700/218, 245, 255, 258, 259, 262; 414/217, 217.1, 266, 267, 273, 274, 277, 279, 935, 937, 938, 939, 941

(56) References Cited

U.S. PATENT DOCUMENTS

| 4,757,355 | A |   | 7/1988  | Iizuka et al. .................. 355/75 |
| 4,986,715 | A | * | 1/1991  | Asakawa ................ 414/331.05 |
| 4,999,671 | A | * | 3/1991  | Iizuka ......................... 355/97 |
| 5,059,079 | A | * | 10/1991 | Foulke et al. ................ 414/275 |
| 5,181,819 | A | * | 1/1993  | Sakata et al. ................ 414/217 |
| 5,562,383 | A | * | 10/1996 | Iwai et al. ................ 414/217.1 |
| 5,565,034 | A | * | 10/1996 | Nanbu et al. ................ 118/668 |
| 5,645,391 | A | * | 7/1997  | Ohsawa et al. ........ 414/416.03 |
| 6,082,951 | A | * | 7/2000  | Nering et al. ............. 414/217.1 |
| 6,302,927 | B1 | * | 10/2001 | Tanigawa .................. 29/25.01 |
| 6,308,107 | B1 | * | 10/2001 | Conboy et al. ............. 700/121 |
| 6,356,804 | B1 | * | 3/2002  | Conboy et al. ............. 700/228 |
| 6,439,822 | B1 | * | 8/2002  | Kimura et al. ......... 414/331.04 |
| 6,445,441 | B1 | * | 9/2002  | Mouri .......................... 355/53 |
| 6,520,727 | B1 | * | 2/2003  | Babbs et al. ................ 414/217 |

FOREIGN PATENT DOCUMENTS

EP           0 940 721 A2        8/1999

OTHER PUBLICATIONS

Patent Abstracts of Japan, vol. 15, No. 387 (Sep. 30, 1991), JP 03 155111 A, Jul. 3, 1991.

Patent Abstracts of Japan, vol. 1999, No. 14 (Dec. 22, 1999), JP 11 249286 A, Sep. 17, 1999.

"Lithography Bay Automation," ©1997, PRI Automation.

"Guardian Bare Reticle Stocker," No date given.

Johnson, C., "Automated Reticle Delivery," *Semiconductor International*, Jun. 2001.

Harris, C., "Integration Key for 300 mm Fab Automation," *Semiconductor International*, Jun. 2001.

(List continued on next page.)

Primary Examiner—Khoi H. Tran
(74) Attorney, Agent, or Firm—Hamilton, Brook, Smith & Reynolds, PC

(57) ABSTRACT

A reticle storage system includes a reticle rack having a series of lateral slots, each for storing a reticle. Access to the reticles is provided on a lateral side of the rack. The enclosure has a series of doors for providing access to the reticles in the slots. An air circulation system flows filtered air past the reticles in the rack to prevent contaminants from accumulating on the reticles. The air circulation system is capable of providing positive air pressure within the enclosure with one door open, thereby preventing contaminants from entering the enclosure through the open door.

23 Claims, 12 Drawing Sheets

OTHER PUBLICATIONS

"Lithography Bay Automation," PRI Automation [online], © 2000 PRI, Revised Feb. 28, 2001 [retrieved on Jun. 1, 2001], Retrieved from Internet <http://www.pria.com/products/fs/pr_fs_litho.htm>.

"PRI Automation Ships First Guardian Bare Reticle Stocker," PRI Automation [online], © 2000 PRI, Revised Apr. 24, 2001 [retrieved on Jun. 1, 2001], Retrieved from Internet <http://www.pria.com/news/press/pri/news_press_pri_010424.htm>.

"Automation for Fab–Wide Material Control," Asyst Automation, No date given.

"New Motion Control Capabilities," Precision MicroDynamics emailed May 31, 2001 from pmdinews@pmdi.com, to info@pmdi.com, [retrieved Jun. 1, 2001], <http://www.p-mdi.com> and <http://www.motionserver.com>.

* cited by examiner

RETICLE STORAGE SYSTEM

RELATED APPLICATION

This application claims the benefit of U.S. Provisional Application No. 60/239,654, filed on Oct. 12, 2000. The entire teachings of the above application are incorporated herein by reference.

BACKGROUND

The fabrication of wafers for electronics typically requires forming patterned layers of photoresist on the wafers which facilitate the formation of electronic circuits thereon. The patterns of photoresist are formed by shining light onto the photoresist through a patterned mask called a reticle. Since the pattern of the reticle is many times larger than the corresponding pattern required on the wafer, the image formed by the light must be reduced before reaching the wafer. Each wafer may require more than 30 different reticles during fabrication, so that a typical wafer manufacturing line processing several different parts may require thousands of reticles to be stored and available for use. The storage unit must keep particles or contaminants off the reticles because such contaminants can adversely affect the fabrication process and cause defects on the product wafers.

SUMMARY

The present invention is directed to a reticle storage system including a reticle rack having a series of lateral slots, each for storing a reticle. Access to the reticles is provided on a lateral side of the rack. The enclosure has a series of doors for providing auxiliary manual access to the reticles in the slots. An air circulation system flows filtered air past the reticles in the rack to prevent contaminants from accumulating on the reticles. The air circulation system is capable of providing positive air pressure within the enclosure with one door open, thereby preventing contaminants from entering the enclosure through the open door.

In preferred embodiments, the reticle rack has a linear row configuration. The reticle rack is formed of rack modules which are capable of being stacked and positioned in a linear row. In one embodiment, the slots are configured to space the reticles about 0.65 inches apart from each other and the reticles are held by static dissipative material. The air circulation system provides a first air flow through the slots of the reticle rack and over any reticles stored therein. A second air flow transverse to the first air flow is provided adjacent to the lateral side of the rack. The first air flow can be about 30 ft./min. and the second air flow can be about 90 ft./min.

A robot is positioned within the enclosure for removing reticles from and replacing reticles in the reticle rack. The robot includes a drive system for driving the robot. A controller for controlling the drive system of the robot calculates a profile of a commanded motion just before the motion is performed. The motion is performed only when the controller determines that the motion can be performed. The controller may be required to recalculate the profile multiple times until the controller determines that the motion can be performed. Typically, the profile is calculated in sections. The robot further includes a gripper arm for gripping the reticles. The gripper arm is driveable by a gripper arm drive, away from and towards the reticle rack. The robot has a vertical column to which the gripper arm is movably mounted. Vertical movement of the gripper arm relative to the vertical column is capable of being provided by a vertical drive. The robot has a carriage to which the vertical column is rotatably mounted. Rotary motion of the vertical column is capable of being provided by a rotary drive. A gripper arm counterbalance for counterbalancing the gripper arm is housed within the vertical column to minimize particle generation and to be positioned near the center of mass of the robot. The drive system includes a bottom drive for driving the carriage of the robot alongside the reticle rack. In one embodiment, the drive system can include a top drive so that the robot can be driven from the top and the bottom, thereby providing precise vertical orientation.

The robot also includes a vision system for determining whether a slot in the reticle rack is occupied or empty, the position of the gripper relative to the slot, and whether the gripper is correctly gripping a reticle. The enclosure includes a robot service location for servicing the robot. The robot service location is capable of being isolated from the reticle rack to prevent contamination of the reticles during service of the robot. A pod opening system is included for placing reticles into and removing reticles from pods with the robot. An emergency access manual tool can attach to the reticle rack for removing and replacing reticles with minimal particle generation.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
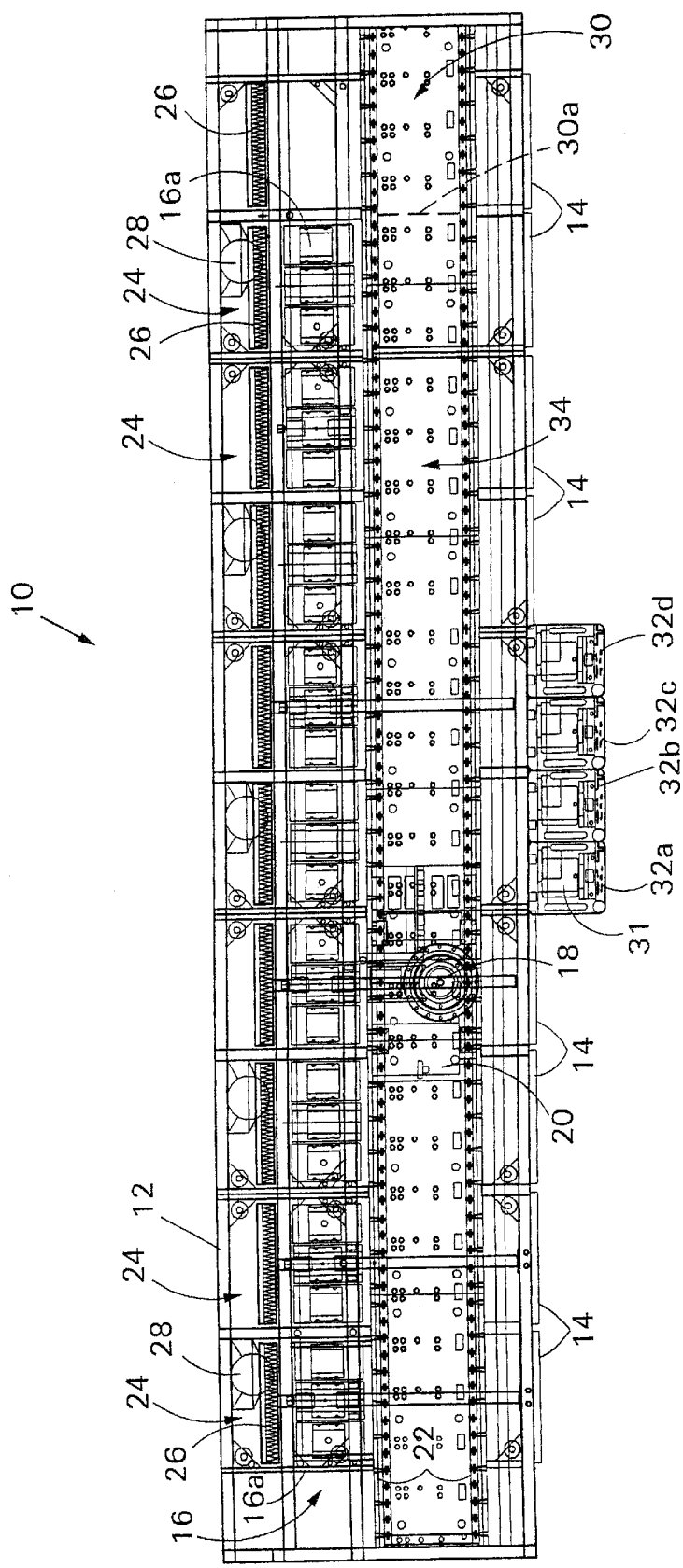
FIG. 1 is a plan sectional view of an embodiment of a reticle storage system of the present invention.
Figure 2:
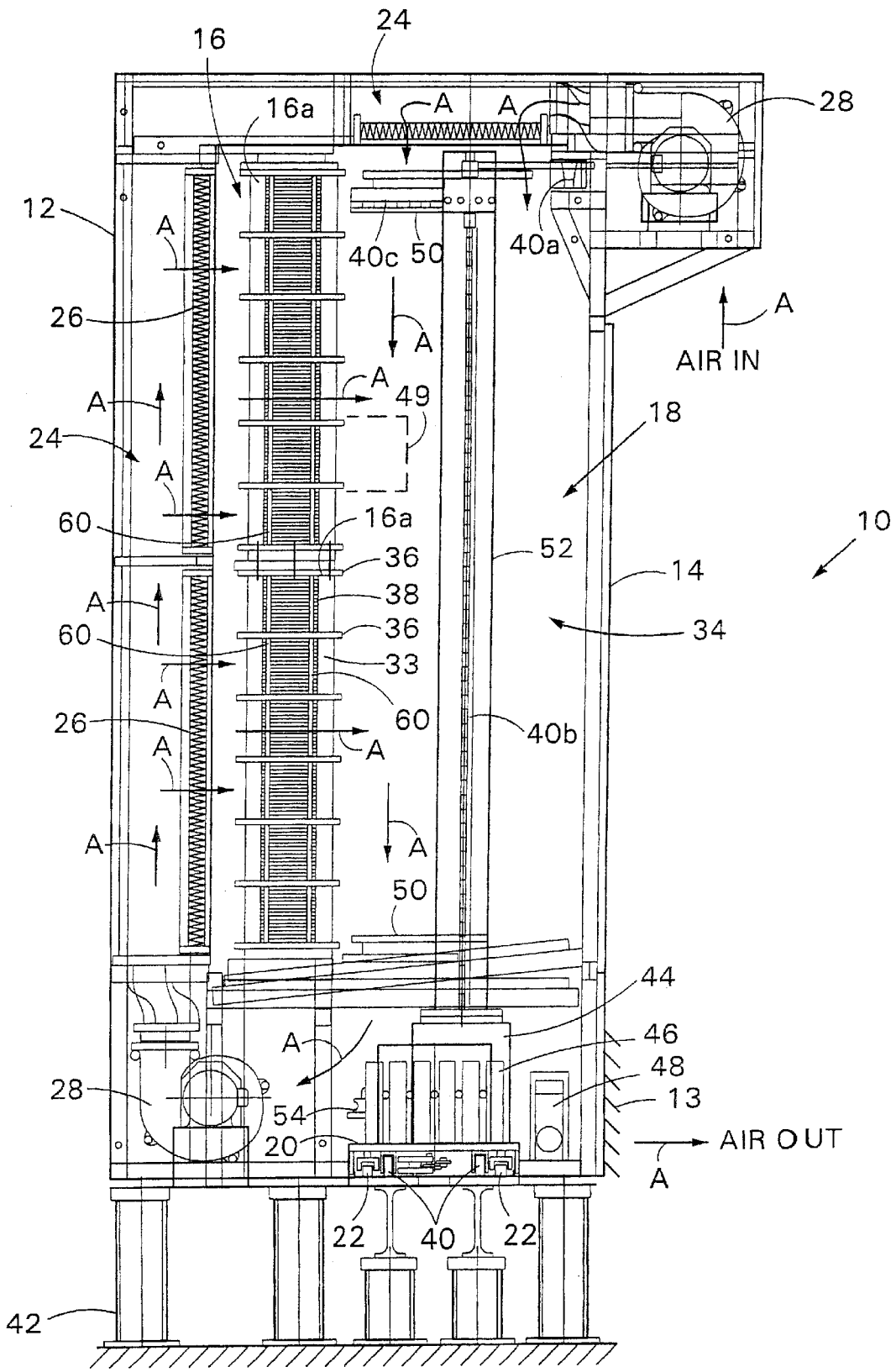
FIG. 2 is an end sectional view of the reticle storage system depicted in FIG. 1.
Figure 3:
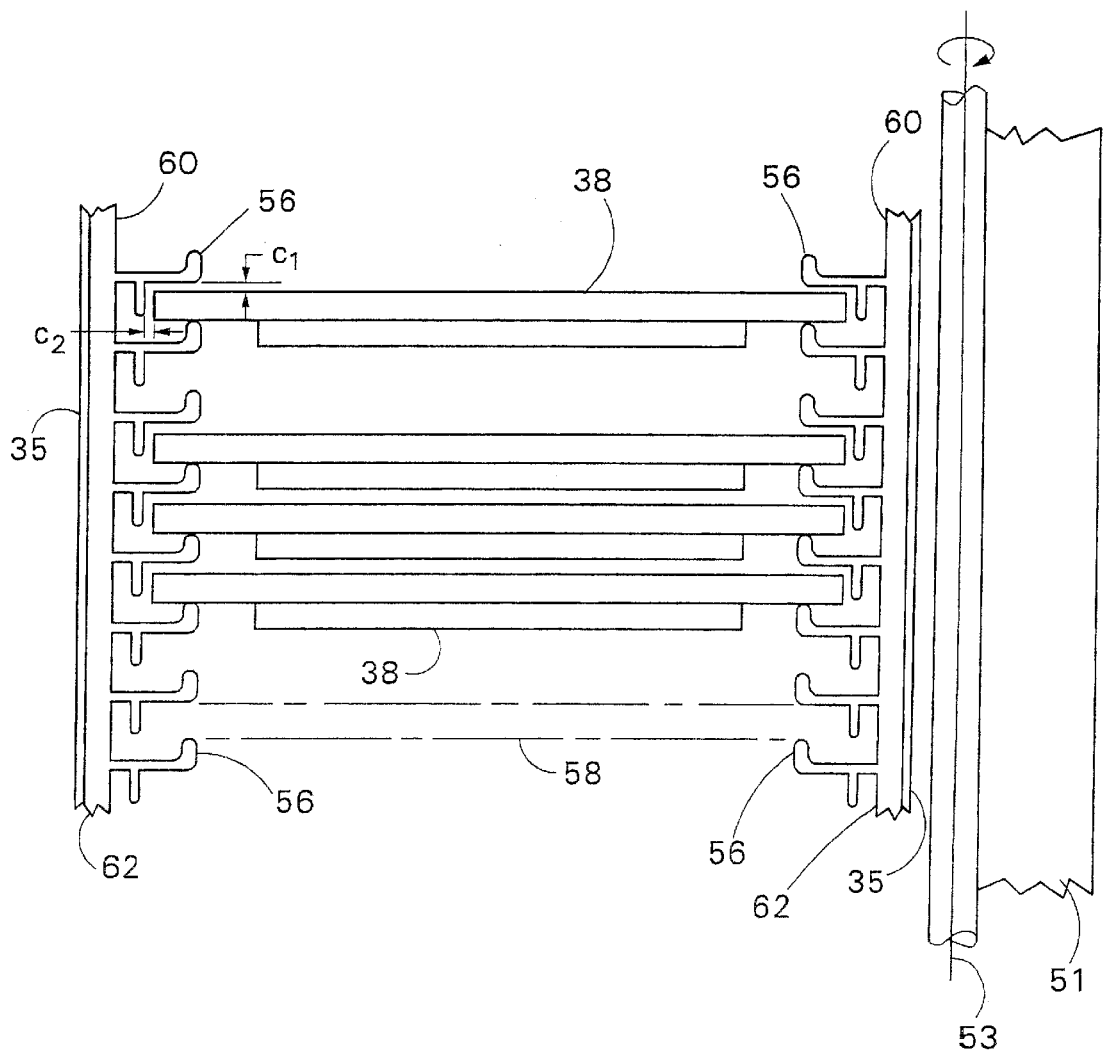
FIG. 3 is a front view of a series of reticles stored in the reticle rack.
Figure 5:
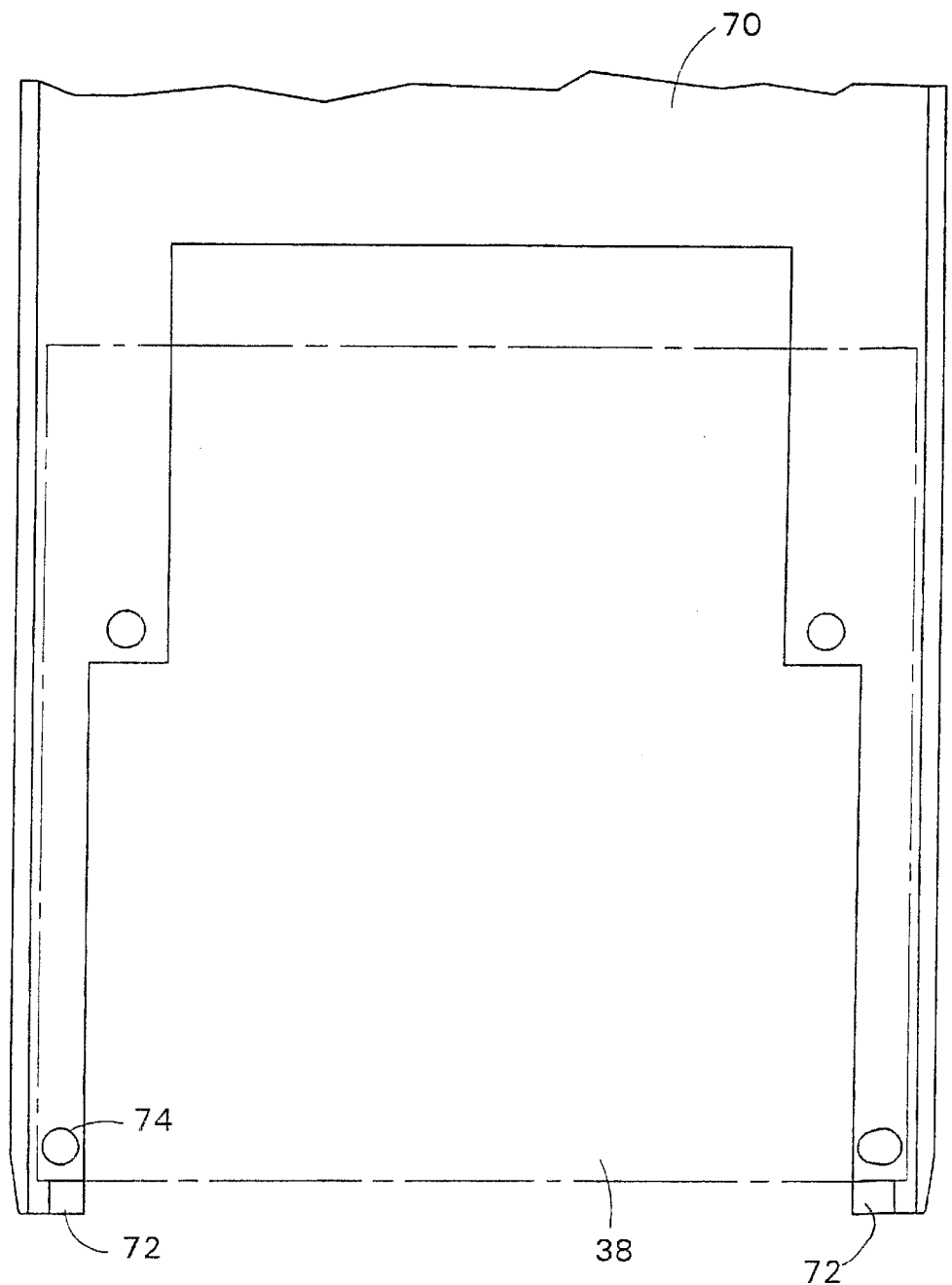
FIG. 5. is a top view of the end of an embodiment of the gripper arm of the robot.

Referring to FIGS. 1 and 2, reticle storage and management system 10 is employed to store/stock and retrieve, bare or open reticles 38 (FIG. 2) in an environment that prevents or limits the accumulation of particles or contaminants on the reticles 38. Reticle storage system 10 includes an enclosure 12 which houses a linear reticle rack 16 in which the reticles 38 are stored in spaces or slots 58 (FIG. 3). The reticles 38 are placed into and retrieved from the rack 16 by a gripper 70 (FIG. 5) on the gripper arm of a robot 18. The robot 18 can travel alongside the rack 16 on a set of linear bearing rails 22. A series of blowers 28 circulate air through a series of filters 26 to form a flow of filtered air vertically downward in front of or adjacent to rack 16, and horizontally through the rack 16 over the reticles 38. The two flows of filtered air at right angles to each other keeps the reticles 38 virtually free of particles. A pod station 32 (FIG. 1) provides the location for removing and returning reticles 38 from and to the system 10. Pod station 32 has a series of pod openers 32a–32d which allows reticles 38 retrieved by robot 18 to be placed into a protective pod 31 that is opened by a pod opener (32a–32d). The pod 31 is then closed for removal by the operator for delivery to the desired destination. The pod openers (32a–32d) also open pods 31 that have been returned to pod station 32 by the operator to allow robot 18 to remove and return the reticles 38 contained thereon to rack 16. Any maintenance on robot 18 can be performed in a service area 30 located at one end of enclosure 12. Service area 30 is located beyond the end of the reticle rack 16 and can be sealed off or isolated from rack 16 by a partition 30a to prevent particles from the maintenance work contaminating any reticles 38. The robot 18 can be moved manually to service area 30 by the operator without entering enclosure 12 by using a cable retrieval system. Enclosure 12 has a series of doors 14 on the front side for allowing access to the rack 16 and service area 30 for maintenance or emergency access, etc.

A more detailed description of reticle storage system 10 now follows. Referring to FIG. 2, air is drawn upwardly into enclosure 12 above doors 14 as indicated by arrows "A" by intake blowers 28 which extend over and beyond the front of doors 14. The air travels horizontally into upper plenum 24 and downwardly through filters 26 into the space or region 34 located between the front of rack 16 and the front of enclosure 12. The air travels vertically downward in a curtain through region 34 in front of rack 16. Some of the air exits enclosure 12 near the bottom of enclosure 12 while the rest of the air is directed by a series of recirculatory blowers 28 located at the bottom rear portion of enclosure 12 upwardly into a rear plenum 24 at the rear of enclosure 12. The air exiting enclosure 12 exits through a series of closeable louvres 13 at the bottom of enclosure 12, or alternatively, the bottom of doors 14. The upwardly moving air moves forwardly through rear filters 26 and through the rack 16 over the reticles 38 in slots 58. The horizontal air flow prevents particles from coming to rest on the reticles 38 and reticle rack 16, and the vertically downward air flow removes particles from region 34. The blowers 28 provide enough air pressure within enclosure 12 so that when a door 14 is opened, for example, during maintenance, or manual auxiliary or emergency removal of a reticle 38 from rack 16, the pressure within enclosure 12 remains higher than the exterior environment so that the air will flow out of the opened door 14 and prevent the entrance of particles into enclosure 12. When a door 14 is opened, the louvres 13 are closed so that all the air leaving enclosure 12 is directed out the opened door 14. The louvres 13 can be closed automatically. In one embodiment, the vertical air flow is about 90 ft/min. and the horizontal air flow is about 30 ft/min. Ionization or ion bars 98 (FIG. 6), are located within the vertical air flow for reducing the build up of static electricity in the system so that particles are less likely to be attracted to the reticles 38 and to prevent damage by electrical static discharge. Ion bars 98 can also be located at pod station 32 to remove static from air surrounding the reticles 38 being returned to the system.

If the air flow is interrupted, air flow sensors 97 (FIG. 6) within enclosure 12 will activate an alarm. In addition, if particles within enclosure 12 exceed an acceptable amount, a particle sensor 96 (FIG. 6) within enclosure 12 will also activate an alarm. The filters 26 are typically standard size 2 ft by 4 ft filters. The rear filters 26 are typically about 4 inches behind rack 16 to obtain a laminar air flow. Drawing the air into enclosure 12 from the front allows the rear of the enclosure 12 to be positioned against a wall. In situations where there is no such wall, air can be drawn in from the rear. Additionally, air can also be drawn in from more than one direction. Enclosure 12 is shown supported by a series of pedestals 42 and can be positioned within a trench in the floor. Alternatively, the pedestals 42 can be omitted.

Reticle rack 16 is typically formed from a series of modules 16a that are stacked upon each other and positioned in a linear row. Consequently, the size of rack 16 is a function of the number of modules 16a used in the vertical and horizontal directions. Each module 16a includes a series of paired front and rear rack members 60 (FIGS. 2 and 3) which are spaced apart from each other in the vertical direction by horizontal shelves 36 and in the lateral direction by sidewalls 35. The horizontal shelves 36 in one embodiment are located about every 11 slots 58 and extend forward a sufficient distance, for example, about four inches to keep the vertical air flow far enough away from the reticles 38 so that the horizontal air flow can flow over the reticles 38. Typically, the shelves 36 and sidewalls 35 are formed of bright stainless steel such as number 8 mirror stainless steel.

The horizontal shelves 36, the sidewalls 35 and the rack numbers 60 of a module 16a form a series of storage bins 33 or, in other words, a module 16a includes a series of storage bins 33. Each storage bin 33 includes four rack members 60, two in the front and two in the rear. The rack members 60 in the front can be colored black and the rack members in the rear can be colored white, or vice versa, so that the vision system on the robot 18 can more easily differentiate between the front and the rear. The rack members 60 can be made of static dissipative material such as plastic and have a vertical or elongate portion 62 (FIG. 4) with a series of arms 56 extending therefrom for supporting reticles 38 thereon. The space between each arm 56 forms the slot 58 for the reticle 38.

Figure 4:
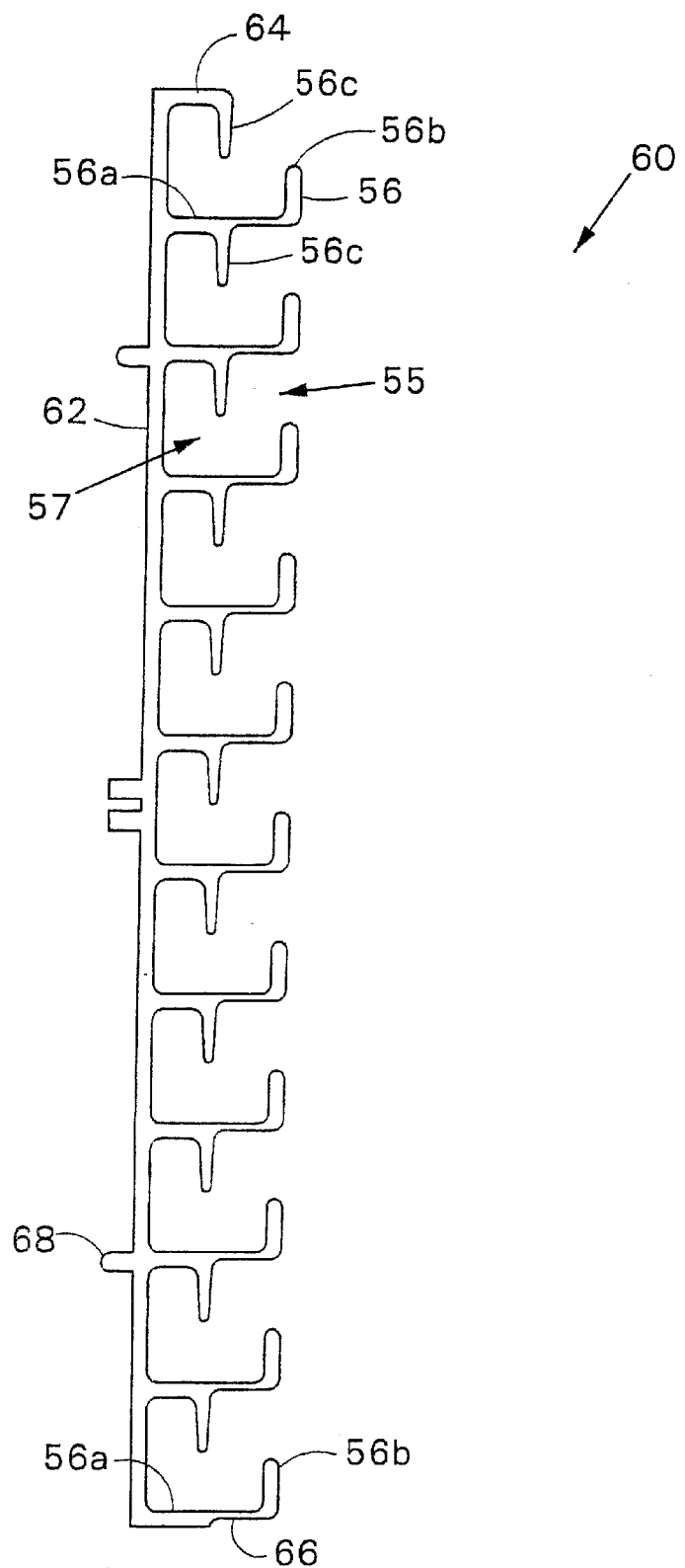
FIG. 4 is a front view of a rack member of the reticle rack.

Referring to FIG. 4, each arm 56 has a horizontal portion 56a and terminates in an upwardly directed vertical finger 56b. A mechanical stop 56c extends downwardly from each arm 56. The top arm 64 of rack member 60 terminates in a mechanical stop 56c and the bottom arm 66 has a horizontal portion 56a and vertical finger 56b, but no mechanical stop 56c. A series of protrusions or tabs 68 extending from vertical portion 62 on the opposite side from arms 56 aid in the proper positioning of rack members 60 relative to side walls 35. In use, each reticle 38 is supported in a slot 58 by four upright fingers 56b of four rack members 60. The two rear rack members 60 can be positioned slightly lower than the two front rack members 60 so that the reticles 38 are inclined slightly backwardly or rearwardly, whereby the reticles 38 are less likely to move out of slots 58 due to vibration. Rear stops can be employed to prevent the movement of the reticles 38 rearwardly. Alternatively, the rack members 60 can be at the same level.

In one embodiment, the rack members 60 are 7.307 inches high and about ½ inch wide. The shelves 36 of storage bins 33 in such an embodiment are spaced 7.67 inches apart. Vertical portion 62 is 0.090 inches thick and arms 56 extend about 0.67 inches from vertical portion 62. Each horizontal portion 56a is 0.590 inches long and each vertical finger 56b is 0.310 inches high. The tips of vertical fingers 56b of adjacent arms 56 are spaced 0.657 inches apart. This in turn positions the reticles 38 at a density of about one every 0.65 inches, or more specifically, 0.657 inches. The space 55 (FIG. 4) between the tip of each finger 56b and the bottom of horizontal portion 56a is 0.348 inches. The mechanical stop 56c extends downwardly 0.318 inches, is 0.280 inches away from vertical portion 62, and is 0.302 inches away from the horizontal portion 56a of the adjacent finger 56. Consequently, when a reticle is positioned within a slot 58, the top surfaces of each reticle 38 have about 0.100 inches clearance $C_1$ (FIG. 3) from the bottom of horizontal portions 56a and the edges have about 0.050 inches clearance $C_2$ from the side of mechanical stops 56c. Since the reticle 38 is typically lifted about 0.050 inches by gripper 70 (FIG. 5) of robot 18 during removal or replacement, this leaves about 0.050 inches in clearance from the top of reticle 38 to the bottom of the adjacent upper arms 56 during lifting. The targeted 0.050 inch clearance is typically enough clearance to account for the positional tolerances of robot 18 without scraping arms 56. The scraping of arms 56 is undesirable because it creates unwanted particles in the system. An additional feature to prevent scraping is provided by the mechanical stops 56c of arms 56. When removing or replacing a reticle 38, the fingers 72 of gripper 70 (FIG. 5) are positioned within the spaces 57 (FIG. 4) under mechanical stops 56c so that if the gripper 70 does happen to lift the reticle 38 too high, the reticle 38 will not scrape against the arms 56 above the reticle 38 because the fingers 72 of gripper 70 will engage the mechanical stops 56c first.

Since the reticle rack 16 is typically formed of modules 16a, the size of enclosure 12 can be made to suit the available space. For example, for a 10 ft. high ceiling, rack 16 can hold 110 reticles 38 in the vertical direction. In addition, since the slots 58 in the storage bins 33 are in vertical columns, if there were 27 columns in rack 16, a total of 2970 reticles 38 could be held by rack 16. For a 12 ft. high ceiling, 132 reticles 38 can be held in a vertical column. As a result, if rack 16 had 27 columns, a total of 3564 reticles 38 could be held by rack 16. In one embodiment, enclosure 12 can be about 5 ft., 1 inch wide by 23 ft., 7 inches long.

Referring to FIG. 3, in some embodiments, a pivotable stop 51 is positioned adjacent to the front of bins 33, and in the event of extreme shaking or vibration, such as in an earthquake, stop 51 will be pivoted by an actuator about a pivot point 53 to a position in front of the reticles 38 to prevent the reticles 38 from falling out. Typically, the stop 51 is activated by an accelerometer. The accelerometer can be positioned within the enclosure 12 or remotely located. Alternatively, stop 51 can be normally closed and only opened when necessary, for instance, when removing or replacing reticles 38.

In cases where the robot 18 is not able to retrieve or replace a reticle 38 from rack 16, an emergency manual retrieval tool 49 (FIG. 2) can be employed. In order to use retrieval tool 49, the door 14 opposite to the desired slot 58 in rack 16 is first opened and the retrieval tool 49 is attached to a pair of shelves 36 above and below the slot 58, typically by clamping thereto. Retrieval tool 49 has a gripper which then precisely indexes down to the desired slot 58 to remove or replace the reticle 38. In this manner, the removal and replacement with retrieval tool 49 can be performed with precision and without scraping the rack 16, thereby minimizing the introduction of particles into the system. Retrieval tool 49 can be manually operated or can have motorized or automated functions. As previously mentioned, the pressure within enclosure 12 is sufficient to flow out through door 14 when the door 14 is opened, so that particles do not enter therethrough. Additionally, the horizontal air flow across the reticles 38 is not affected by an open door 14. Consequently, any reticle 38 can be removed or replaced by retrieval tool 49. Alternatively, although less desirable, reticles 38 can be removed and replaced by hand. The retrieval tool 49 can also be used to place reticles 38 in the pods 31.

Figure 6:
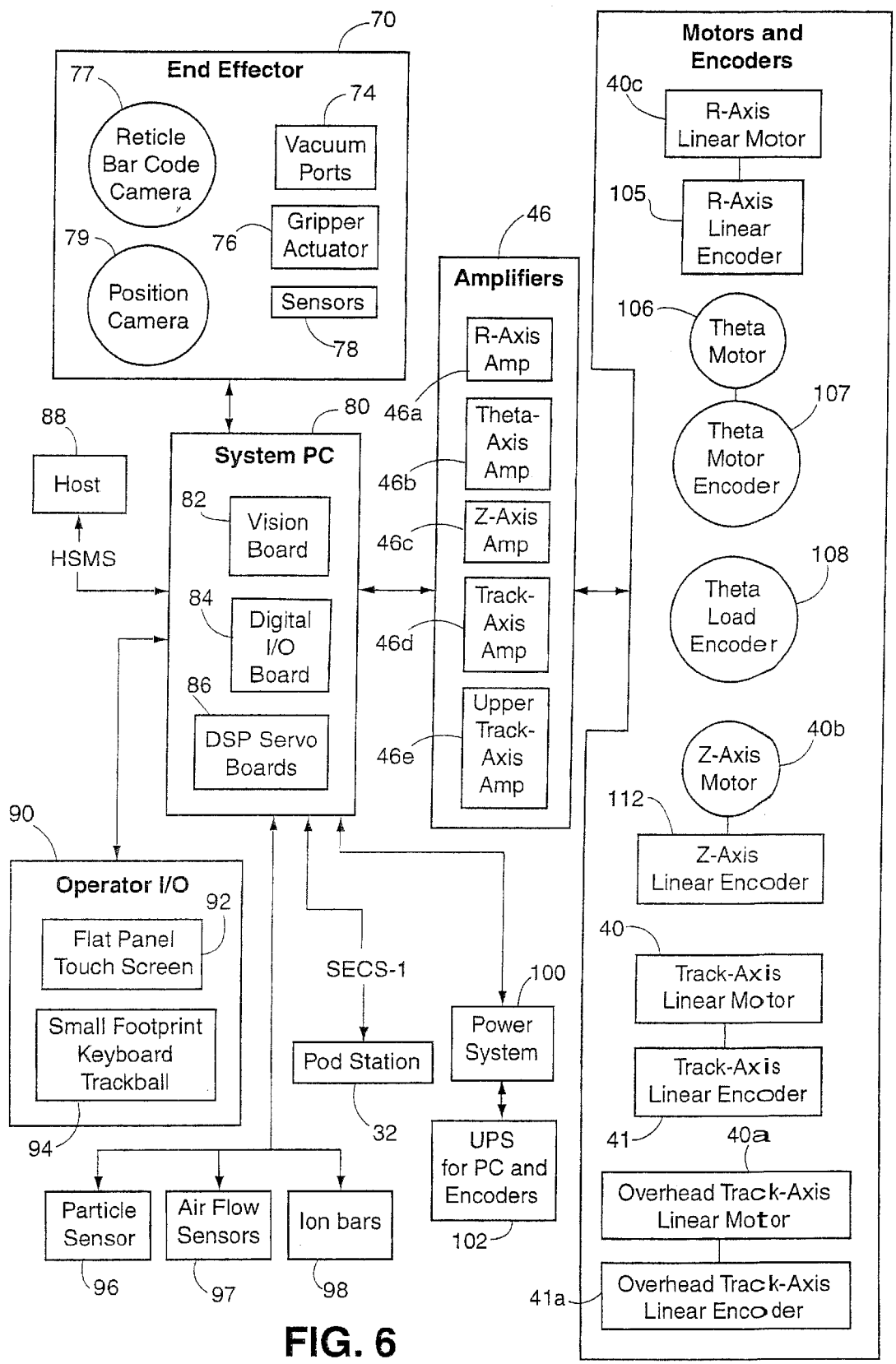
FIG. 6 is a schematic drawing of the electrical components of the reticle storage system depicted in FIG. 1.

Referring back to FIGS. 1 and 2, robot 18 has a drive system that produces minimal particles. Robot 18 includes a carriage 20 that is translatable alongside reticle rack 16 within region 34 along a pair of linear bearing rails positioned under the carriage 22. The carriage 20 is driven by a bottom linear drive including a pair of track-axis linear servo motors 40. Each track-axis linear motor 40 is magnetically operated and preferably includes a linear inner rail mounted to the bottom of enclosure 12 adjacent to a linear bearing rail 22, and a linear outer rail mounted to the bottom of carriage 20 which surrounds three sides of the inner rail without contacting the inner rail. Consequently, linear motors 40 have no moving contacting parts which would introduce particles into the system. The robot 18 has a vertical column 52 which is rotatably mounted to carriage 20 by pedestal base 44. The vertical column 52 is rotated by a rotary drive 54 (FIG. 2) which typically is belt driven by a rotary servo theta motor 106 (FIG. 6). Minimal particles are produced by the belt drive. Typically, 360° of rotation is provided while 180° is normally required. Associated rotary bearings are housed within base 44 to minimize particles. The gripper arm 50 is translatable between the top and bottom positions shown in FIG. 2 along vertical column 52 by a vertical drive that includes a linear Z-axis motor 40b. The gripper or end effector 70 (FIG. 5) at the end of gripper arm 50 is translatable away from and towards vertical column 52 by a linear gripper drive that includes an R-axis linear motor 40c. The motors 40b and 40c are similar to motor 40. The linear motor 40c moves gripper 70 into and out of slots 58 (FIG. 3) of rack 16.

Gripper 70 is static dissipative and has slender fingers 72 which are configured for insertion into slots 58. A camera 79 (FIG. 6) is mounted to gripper 70 to determine whether a slot 58 in the reticle rack 16 is occupied or empty, the position of the gripper 70 relative to the reticle rack 16 or a particular slot 58, and whether the gripper 70 is correctly gripping a reticle 38. A second camera 77 on gripper 70 is employed to read the bar codes of the reticle 38 in the gripper 70. In one embodiment, gripper 70 includes a series of vacuum ports 74 (FIG. 5) for gripping the reticles 38. In another embodiment, gripper 70 includes mechanical grippers which are activated to grip the reticles 38. In such a case, a gripper actuator 76 and sensors 78 (FIG. 6) would be employed. The sensors 78 would verify that the reticle 38 is seated properly. Also, the cameras 79 and 77 can be mounted to gripper arm 50 instead of gripper 70.

An overhead drive having an overhead track-axis linear motor 40a can be optionally employed at the top of robot 18 (FIG. 2). In such a case, driving robot 18 from both the top and bottom allows for precise vertical alignment of robot 18, thereby compensating for any tilting of robot 18. The use of the third overhead track-axis linear motor 40a may be useful when reticle rack 16 and robot 18 are tall. When robot 18 is tall, any tilting of robot 18 results in greater horizontal deviation and tilt in the longitudinal direction of rails 22 at the top of robot 18. Providing gripper arm 50 with rotational movement about its longitudinal axis can be employed as a substitute for the third overhead track-axis linear motor 40a to compensate for tilting.

In one embodiment, the linear motors 40, 40b, 40c, and optionally 40a, employ non-contacting linear encoders 41, 112, 105, and optionally 41a, (FIG. 6) which have 10,000 to 100,000 counts/inch with 50,000 counts/inch being common. The rotary theta motor 106 employs a rotary theta encoder 107 which has 100,000 to 500,000 counts per 360° rotation with 180,000 counts being common. Rotary motor 106 also has a theta load encoder 108. Robot 18 can have motions having an accuracy of better than +/–0.005 inches. Consequently, due to the positional accuracy of robot 18, the 0.050 inch clearance provided between gripper 70 and the fingers 56 of rack members 60 by their relative dimensions, is sufficient clearance to avoid scraping of the gripper 70 and reticle 38 with rack members 60 during removal and replacement of the reticles 38. Although 0.050 inch clearance is the target clearance, in some instances, due to dimensional differences or variations, the clearance may sometimes in some locations be lower than 0.050 inches, for example, as low as 0.040 inches. However, such lower clearances are typically still large enough to allow for the positional tolerances of robot 18.

FIG. 6 depicts typical electrical components of reticle storage system 10 in one embodiment. A system computer 80 for controlling robot 18 is connected to a host computer 88. The system computer 80 includes a vision board 82, a digital I/O board 84 and servo boards 86. An operator I/O system 90 having a touch screen 92 and keyboard with trackball 94 provides operator interface with system computer 80. Particle sensor 96, air flow sensors 97 and ionization or ion bars 98 are connected to the system computer 80. Pod station 32 is controlled by system computer 80. Amplifiers 46 consisting of an R-axis amp 46a, a theta-axis amp 46b, a Z-axis amp 46c, a track-axis amp 46d and, optionally, an upper track axis amp 46e, are connected to the system computer 80 and the respective motors 40c, 106, 40b, 40 and (optionally) 40a of robot 18. The reticle bar code camera 77, position camera 79, and vacuum ports 74 of the gripper or end effector 70 are connected to system computer 80. When employed, gripper actuator 76 and sensors 78 would also be connected to system computer 80. Electrical power to system computer 80 is provided by power system 100 which is backed up by an uninterruptible power supply (UPS) 102 for the system computer 80 and all the encoders of robot 18. In the event that power is lost, the system computer 80 will monitor the UPS 102 and will allow an orderly shutdown of the system computer 80 if power is not restored shortly. By powering the encoders, the position of robot 18 will not be lost during short power interruptions. The blowers 28 are typically connected to the factory emergency power circuit to keep clean air flowing over the reticles at all times, even during power outages.

Figure 7:
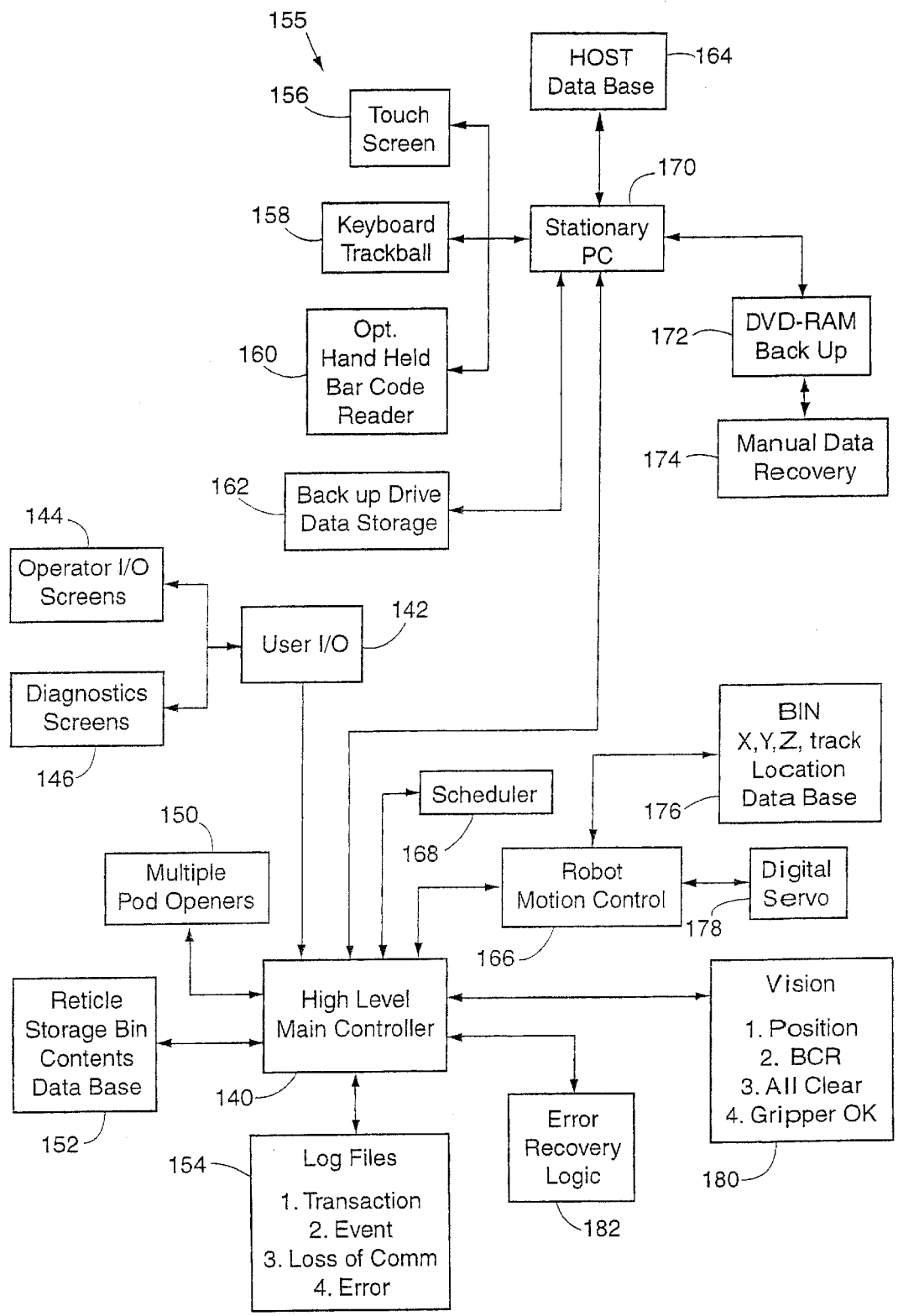
FIG. 7 is a schematic diagram of the software modules for the reticle storage system depicted on FIG. 1

FIG. 7 depicts software modules 155 for reticle storage system 10 in one embodiment. A stationary computer module 170 is connected by an interface with a host data base module 164. A touch screen module 156, keyboard with trackball module 158 and, optionally, a hand held bar code reader module 160 are connected to each other and the stationary computer module 120. A back up drive data storage module 162 provides back up for stationary computer module 170. Redundant back up is provided by DVD-RAM back up module 172 and manual data recovery module 174. Stationary computer module 170 is connected by an interface with high level main controller module 140. A scheduler module 168 for scheduling the operation of reticle storage system 10 is connected to high level main controller module 140. A bin X, Y, Z track location data base module 176 and a digital servo module 178 are connected to a robot motion control module 166 which in turn is connected to the high level main controller module 140. A vision module 18 connected to module 140 verifies the position of robot 18, whether slots 58 are full or empty, whether the reticle 38 is gripped correctly, and controls bar code reading. A multiple pod opener module 150 is connected to main controller module 140. Also connected to main controller module 140 are reticle storage bin contents data base module 152, log files module 154 including transaction, events, loss of communications to the host and error, and error recovery logic module 182. Finally, an operator I/O screens module 144, diagnostic screens module 146, and user I/O module 142 are connected to each other and main controller module 140.

Retrieving or replacing a reticle with robot 18 typically requires motions along multiple axes to arrive at the required location. First, a trajectory of the commanded motion is calculated by the system computer 80 to see if the motion can be performed. Parameters such as acceleration, jerk and velocity along each axis are taken into account. A permissible motion is defined as having a particular range of such variables. The motion of each axis of robot 18 is calculated. If the system computer 80 determines that the motion is possible, then robot 18 is allowed to perform the motion. If the motion is not possible, the motion is recalculated until a solution is found before the motion is allowed to be made. As a result, multiple iterations may be conducted before a solution is found. By calculating the commanded motions of robot 18 just prior to performing the motion, the robot 18 does not attempt to begin motions that robot 18 cannot perform, and therefore, typically does not lock up. Consequently, each motion is tested by the system computer 80 before being performed. This also minimizes the real time requirements of the computer during movement of robot 18.

A more detailed description of calculating the motions of robot 18 now follows. Moving robot 18 from one location to a second location requires that the robot 18 moves in a predetermined fashion. The slots 58 and pod opener locations are stored in computer memory as bin location parameters. These parameters determine the length of the moves that the various axes have to perform as well as the sequence of moves to reach one bin location from the other bin location. A software program translates the bin location parameters to actual axis moves.

Axis moves are subject to several additional parameters. The speed of the move is determined by load requirements, such as if the robot 18 moves with a reticle 38 in the gripper 70 or without a reticle 38. In the first case, the motion would be slow. In the second case, the motion could be quicker. Different speed tables are set up to predetermine slow and fast motions. These speed tables define parameters like maximum velocity, acceleration, deceleration, jerk, and other performance parameters.

Using all of these parameters and the distance of the move, the computer determines the best combination to perform the required move. An actual move profile, a velocity versus time curve, is calculated. Every point of this curve is checked to verify that the move is smooth and that it falls within the capability of the servo axis. After this verification, the resultant proper move parameters are sent to the controller. To limit the amount of information transfer between computer and controller, the move is broken up into segments. A segment is defined as a region where the jerk is constant. Each segment is described by 3 parameters, the starting position, the starting velocity, and the time. In addition the calculated parameters for the 7 segment profile are transmitted. A 7 segment profile is defined as motion between two points that can be described by a distance L7, a starting velocity Vo, a maximum center velocity Vc, an ending velocity Ve, a maximum acceleration Au, a maximum deceleration Ad, and a maximum constant jerk. The controller recalculates the move and then starts and controls the actual axis move.

The actual move does not start until the computer has first verified that the move falls within the capability of the servo axis and can be performed. This prevents rough servo action or perhaps aborted moves both detrimental to the smooth motion of reticles 38 and to the operation of a reliable system. A move may consist of one single profile or several profiles strung together. Each profile is described by the following parameters:

L0=starting point
L7=the end point
Vo=the starting velocity
Vm=the center of maximum velocity
Ve=the end velocity
Jm=the maximum jerk
Au=maximum acceleration
Ad=deceleration The computer verifies that the move can be performed by adjusting these parameters until the move is possible, and then verifying the complete trajectory, point by point, to check for abrupt motion changes.

To simplify the mathematics, the move is broken down into segments of motion, each segment covering only a limited distance. When these segments are connected smoothly together, the original move is recreated. Each segment can be defined by a simpler equation and a set of boundary conditions where one segment connects to the next.

When the computer calculates the move, the computer first determines how many profiles are involved. For a single profile, the computer first splits the move distance L7 in half. The computer calculates the maximum velocity V3 for the three segment accelerating profile and the maximum velocity V4 for the three segment decelerating profile.

V3 and V4 are compared and the higher one is reduced to the lower. The lowered 3 segment profile is then recalculated and results in a new L3 or L4 distance. The distance between the old center and the new distance is split in half resulting in a new center distance. The calculation is then repeated resulting in new center velocities V3 and V4. These are again compared. The higher is reduced to the lower and the calculation is repeated. A new center distance is found and so on until the velocities are the same.

For multiple profiles the computer calculates the 3 segment profiles starting at the beginning zero velocity point. During acceleration, since the starting velocity of the new profile is the end velocity of the previous profile, the profiles can be connected together.

If a deceleration profile is encountered, the calculation will use its specified end velocity to calculate a starting velocity. This starting velocity may not match the ending velocity of the previous profile. Then the ending velocity of the previous acceleration profile is adjusted and all previous profiles are recalculated for this new value. The process is repeated if a second deceleration profile is encountered until all profiles are processed.

Figure 8:
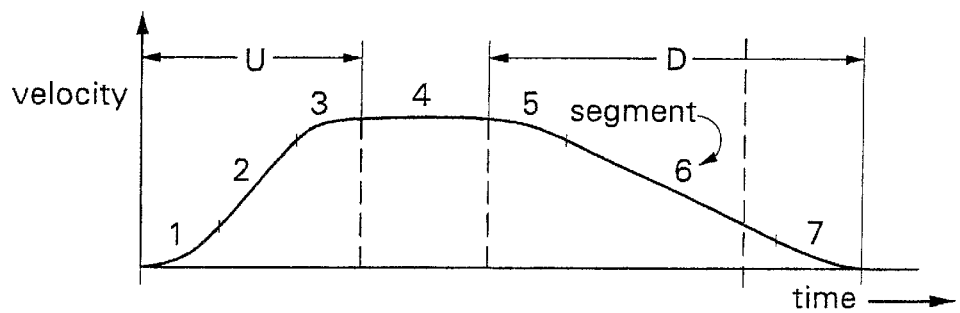
FIG. 8 is a velocity versus time plot of a 7 segment profile.

A single profile move commonly has 4–7 segments. A velocity versus time plot of a typical 7 segment profile is shown in FIG. 8. The segments are numbered as shown on the graph.

The profile can usually be divided into two sections, a U (acceleration) section and a D (deceleration) section. The curve starts at zero velocity. The first segment shows an increasing acceleration. The second segment shows a constant acceleration. The third segment shows a decreasing acceleration. The fourth segment shows zero acceleration resulting in a constant velocity. The fifth segment shows an increasing deceleration. The sixth segment shows a constant deceleration. The seventh segment shows a decreasing deceleration. At the end of the move, the deceleration is zero and the velocity is zero.

The single profile move can be specified by five parameters. Typical inputs to the computer are: the distance of the move L7, the maximum allowed acceleration Au, the maximum allowed deceleration Ad, the maximum jerk Jm, and a maximum allowed velocity Vm. The computer takes these values and calculates an optimal profile by adjusting Au, Ad, and Vm.

Figure 9:
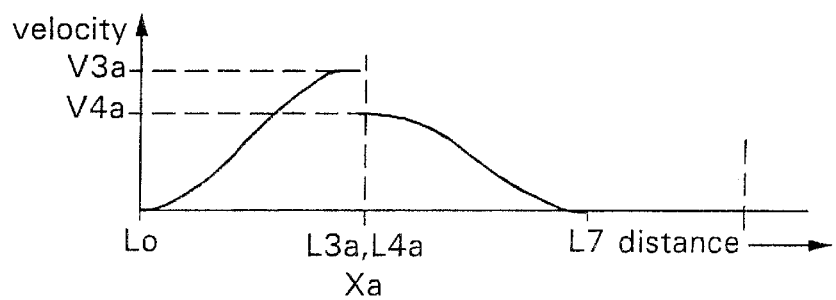
FIGS. 9–12 are velocity versus distance graphs depicting the calculation process of motion profiles.

The calculation proceeds in the following way. The profile is split into two sections. Section U starts at the distance L0 and ends at distance L3. Section D starts at distance L4 and ends at L7. L7 is the distance of the complete move. Each section consists of at most 3 segments. FIG. 9 shows the relation between velocity and distance.

For the first calculation, distance L7 is divided by two. We will call that distance Xa where Xa-L7/2. Then L3a is set to Xa and L4a is set to Xa. Using L3a and L4a the velocity V3a is calculated for section U and V4a is calculated for section D.

Figure 10:
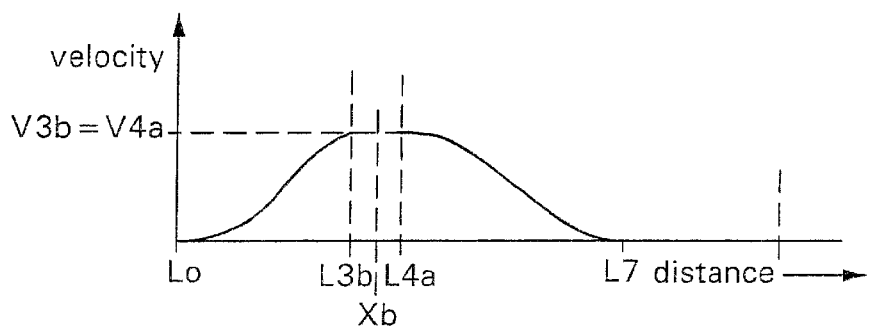
Figure 11:
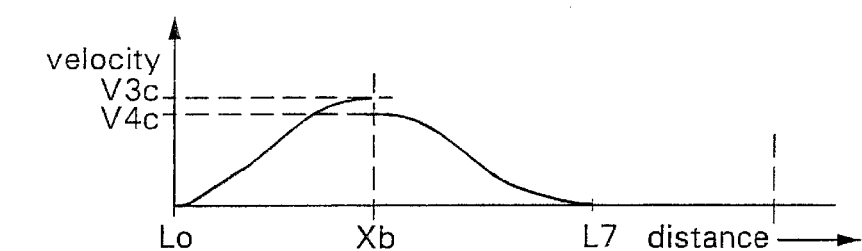

The two velocities V3a and V4a are compared with each other and the higher velocity is set to the lower velocity value. Let us assume V4a is the lower velocity. Then V3a is changed to V3b to equal V4a. The new velocity V3b is used to recalculate section U and results in a new distance L3b. L4a has not changed (FIG. 10). The distance between the new L3b and the old L4a is then divided into two and results in a new distance Xb. This new Xb value is used to recalculate the sections U and D and results in new values for V3b and V4a, V3c and V4c, respectively (FIG. 11).

Figure 12:
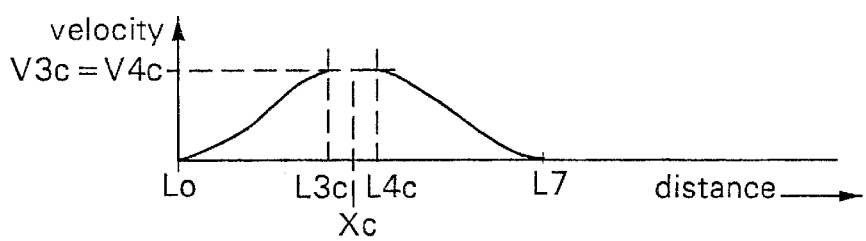

Again the upper velocity is changed to match the lower velocity and a new Xc is calculated (FIG. 12). This process repeats until the two velocities are equal within some minimum allowable.

Figure 13:
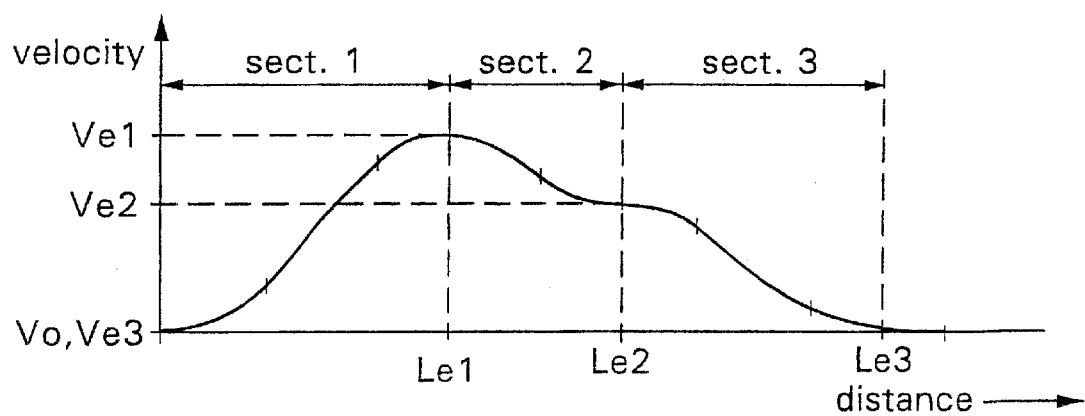
FIG. 13 is a graph of a multiple profile move with 3 sections.

For the multiple profile move, the scheme is similar but more involved. FIG. 13 shows a multiple profile move with 3 sections. For this calculation it is best to work with 3 segment sections or profiles. Each section is described by a maximum allowed acceleration Au, a maximum allowed deceleration Ad, a maximum allowed velocity Vm, an ending velocity Ve, a jerk Jm, and an end position Le. The starting velocity Vo is taken to be the ending velocity Ve of the preceding profile. The program uses these values to create a 2 or 3 segment profile which is either an acceleration section or a decelerating section depending on the values of Vo, Vm and Ve.

Calculation starts with the first section from Lo to Le1. For this section the starting velocity Vo1 is zero and the ending velocity is Ve1. Thus it is an accelerating section.

The next section, from Le1 to Le2, is then calculated starting with Ve1 and ending with Ve2. If Ve2 is higher than Ve1 the two sections can be connected together. If Ve2 is lower than Ve1 then the second section is a deceleration section. If the available distance is too short, the two sections will not join properly. In that case it will be necessary to lower Ve1 and section one needs to be recalculated using the new Ve1 and the old Vo. The new Ve1 and Ve2 then satisfy the combination of the first two sections.

The third section then gets evaluated using Ve2 and Ve3 as the new boundaries. Again, if Ve3 is higher than Ve2, the new section can be connected to the first two sections. If Ve3 is lower than Ve2, then the same process as above is performed. Section one and section two both are reevaluated to satisfy Ve3. This process is repeated until all sections have been checked out and the final velocity ends up as zero.

At the end, the program performs one additional check. It is possible that the stopping requirements, due to the first deceleration section, cause the maximum velocity of the last accelerating section to be very low, resulting in a long slow move. By recalculating the last acceleration section as a seven segment profile, a higher center velocity may be found without affecting the velocity at the endpoints.

Figure 14:
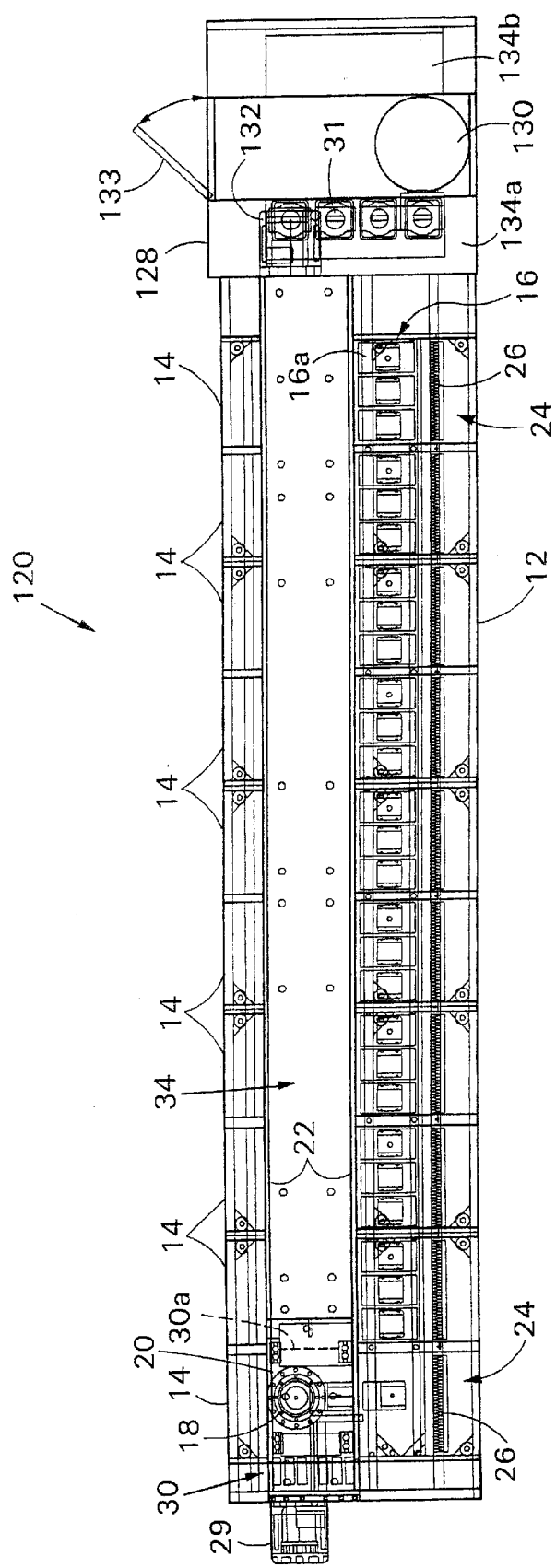
FIG. 14 is a plan sectional view of another reticle storage system of the present invention having an automated pod handling system.

Referring to FIG. 14, reticle storage and management system 120 is another embodiment of the present invention. Reticle storage system 120 differs from system 10 in that instead of having a pod station 32 opposite to the front face of reticle rack 16 from which the operator manually removes or places pods 31, system 120 has an automated pod station 128 located at one end of enclosure 12 and a manual pod station 29 having a single pod opener at the opposite end of enclosure 12. The manual pod station 24 is located beyond service area 30 to provide manual pod access. During typical use, the automated pod station 128 is the pod station that is employed and opens pods 31 with a pod opener 132 which is aligned with region 34 for receiving or returning reticles 38. The pods 31 are handled within pod station 128 by a pod handling robot 130 and can be stored or placed in areas 134a and 134b on opposite sides of robot 130. Access to pod station 128 by the operator is provided by a door 133.

Figure 15:
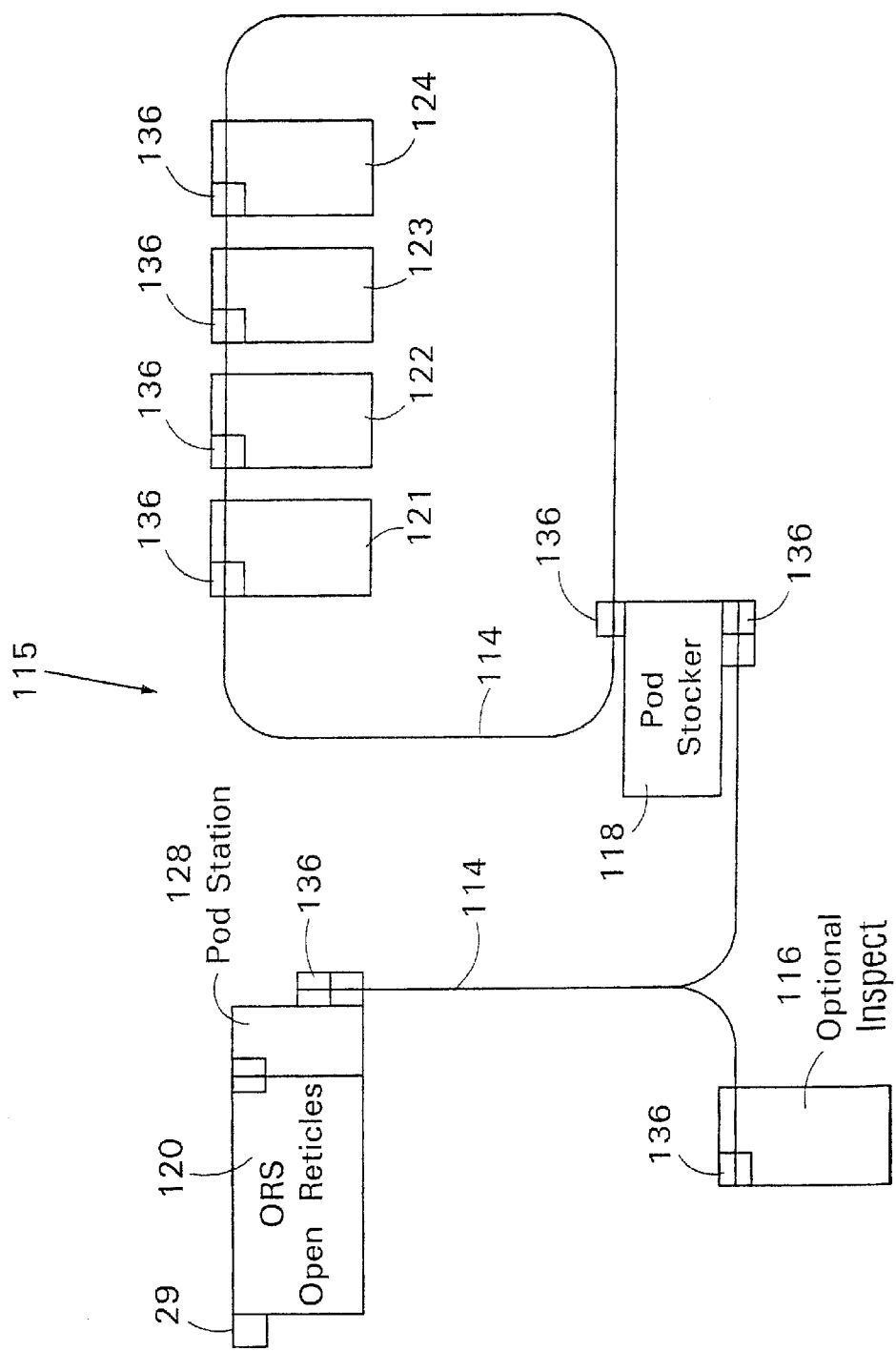
FIG. 15 is a schematic plan view of the reticle storage system of FIG. 14 connected to a pod conveyance system.

Referring to FIG. 15, the automated pod station 128 of reticle storage system 120 is connected to an overhead track pod conveyance system 115 which automatically conveys pods 31 between pod station 128 and wafer fabrication process stations 121–124. Pod station 128 has a pair of pod terminals 136 where pods 31 are placed onto the track 114 or removed therefrom. The pods 31 typically travel on the track 114 to the pod terminals 136 of a pod stocker 118. The pod stocker 118 stores pods 31 having reticles 38 required for a particular lot, or amount of time, such as a shift. Pods 31 containing reticles 38 required for current use in process stations 121–124 are removed from pod stocker 118 via pod terminal 136 and put onto another track 114 for delivery to the pod terminals 136 of process stations 121–124. Reticles 38 no longer being used are brought back to the pod station 128 at reticle storage system 120 in pods 31 via pod conveyance system 115. Reticles 38 can also be brought to an inspection station 116 by pod conveyance system 115 to inspect for damage and/or particles on the reticles 38. The pods 31 can be designed to carry a single reticle 38 or multiple reticles 38. Some pods 31 are configured to carry six reticles 38.

Figure 16:
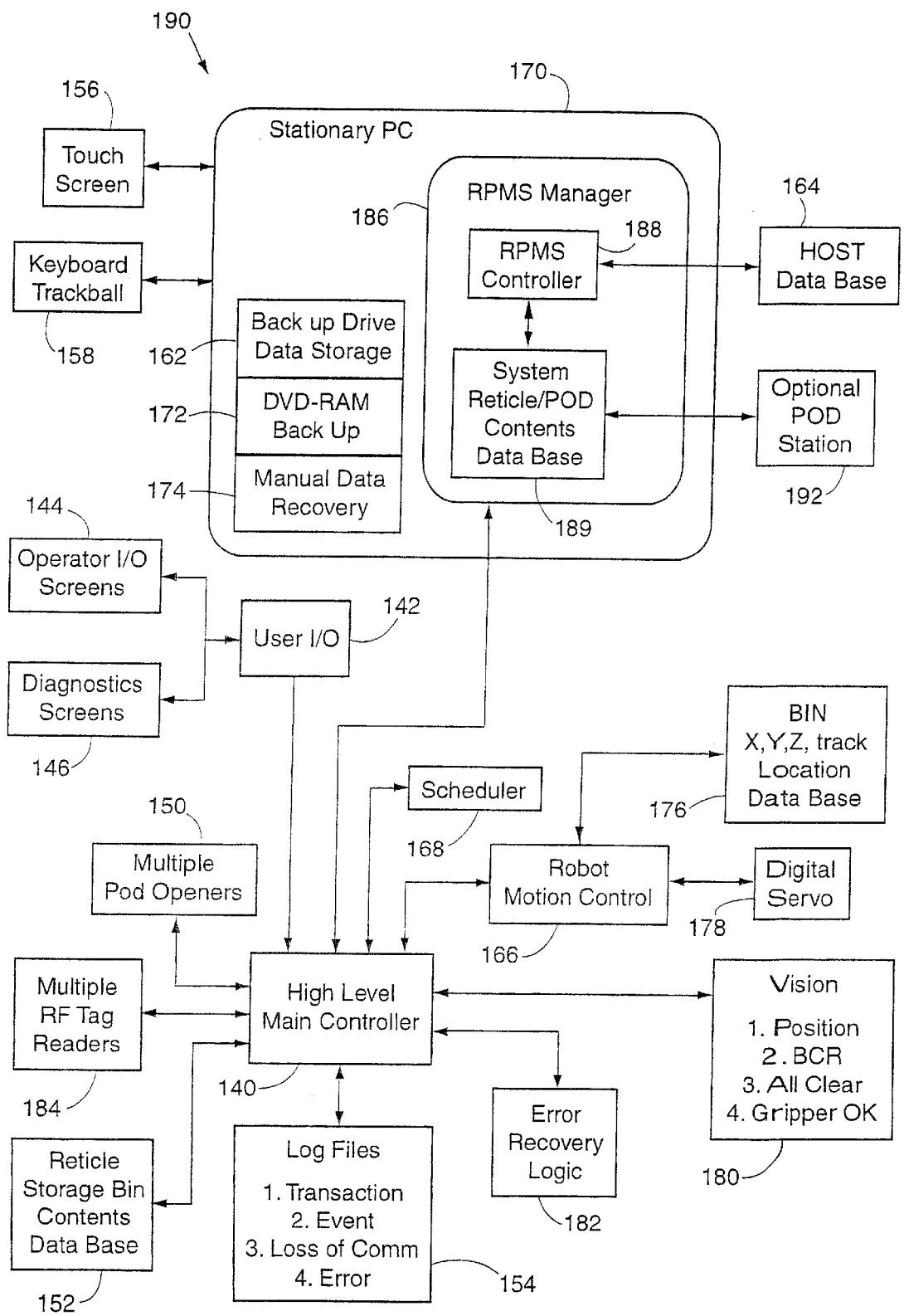
FIG. 16 is a schematic drawing of the software modules for the reticle storage system of FIG. 14.

Referring to FIG. 16, the software modules 190 for reticle storage system 120 differ from the software modules 155 of system 10 in that a multiple RF tag readers module 184 for reading tags on the pods 31 is connected to main controller module 140. The stationary computer module 170 is connected to a reticle pod management system (RPMS) manager module 186 which controls a RPMS controller module 188 and a system reticle/pod contents data base module 189.

The RPMS controller module 188 is connected to host data base module 164. The system reticle/pod contents data base module 189 can be connected to an optional pod station module 192 for controlling pod station 128 (FIGS. 14 and 15).

While this invention has been particularly shown and described with references to preferred embodiments thereof, it will be understood by those skilled in the art that various changes in form and details may be made therein without departing from the scope of the invention encompassed by the appended claims.

For example, components or features of systems 10 and 120 can be omitted or combined. In addition, although gripper 70 has been described to grip the reticles 38 either by vacuum or mechanically, gripper 70 can hold the reticles 38 with a traylike configuration. Such a configuration can have a recess for capturing the reticles 38. Also, although reticle rack 16 has been described as being in a linear row, the rack 16 can also be curved or circular with robot 18 traveling in a curved path around rack 16. Furthermore, robot 18 can have different configurations than those described above. Although robot 18 has been described to travel on linear rails 22, alternatively, robot 18 can travel on wheels over a flat surface. Also, the linear motors can be replaced with belt, cable, pneumatic/hydraulic, gear, or rack and pinion drives. Although paired rack members 60 in the front and rear are described for supporting reticles 38, alternatively, other suitable rack configurations can be employed, such as two opposed rack members which extend the length of the sides of the reticles 38.

What is claimed is:

1. A reticle storage system comprising:
    a reticle rack in a linear row configuration having a series of lateral slots, each for storing a reticle, access to the reticles being provided on a lateral side of the rack;
    an enclosure for housing the rack, the enclosure having a series of doors for providing access to the reticles in the slots;
    an air circulation system for flowing filtered air past the reticles in the rack to prevent contaminants from accumulating on the reticles, the air circulation system capable of providing positive air pressure within the enclosure with one door open, thereby preventing contaminants from entering the enclosure through the open door;
    a robot positioned within the enclosure for removing reticles from and replacing reticles in the reticle rack, the robot including a drive system for driving the robot; and
    a controller for controlling the drive system of the robot, the controller calculating a profile of a commanded motion before said motion is performed, said motion being performed only when the controller determines that said motion is capable of being performed.

2. The system of claim 1 in which the controller recalculates said profile until the controller determines that said motion is capable of being performed.

3. The system of claim 1 in which the controller calculates said profile in sections.

4. The system of claim 1 in which the robot further includes a gripper arm for gripping the reticles, the gripper arm being driveable by a gripper arm drive away from and towards the reticle rack.

5. The system of claim 4 in which the robot has a vertical column to which the gripper arm is movably mounted, vertical movement of the gripper arm relative to the vertical column capable of being provided by a vertical drive.

6. The system of claim 5 in which the robot has a carriage to which the vertical column is rotatably mounted, rotary motion of the vertical column capable of being provided by a rotary drive.

7. The system of claim 5 in which the robot includes a gripper arm counter balance, the counter balance being housed within the vertical column to minimize particle generation and to be positioned near the center of mass of the robot.

8. The system of claim 6 in which the drive system includes a bottom drive for driving the carriage of the robot alongside the reticle rack.

9. The system of claim 4 further comprising a vision system for determining whether a slot in the reticle rack is occupied or empty, the position of the gripper relative to the slot, and whether the gripper is correctly gripping a reticle.

10. The system of claim 8 further comprising a pod opening system for placing and removing reticles from pods with the robot.

11. The system of claim 1 further comprising a manual tool for attaching to the reticle rack for removing and replacing reticles with minimal particle generation.

12. The system of claim 1 in which the enclosure includes a robot service location for servicing the robot, the robot service location capable of being isolated from the reticle rack to prevent contamination of the reticles during service of the robot.

13. A method of storing and managing reticles comprising:

storing reticles in lateral slots of a reticle rack in a linear row configuration, access to the reticles being provided on a lateral side of the rack;

housing the rack in an enclosure, the enclosure having a series of doors for providing access to the reticles in the slots;

flowing filtered air past the reticles in the rack with an air circulation system to prevent contaminants from accumulating on the reticles, the air circulation system capable of providing positive air pressure within the enclosure with one door open, thereby preventing contaminants from entering the enclosure through the open door;

removing reticles from and replacing reticles in the reticle rack with a robot positioned within the enclosure;

driving the robot with a drive system; and calculating a profile of a commanded motion of the robot with a controller before said motion is performed, said motion being performed only when the controller determines that said motion is capable of being performed.

14. The method of claim 13 further comprising recalculating said profile until the controller determines that said motion is capable of being performed.

15. The method of claim 13 further comprising calculating said profile in sections.

16. The method of claim 13 further comprising providing the robot with a gripper arm for gripping the reticles, the gripper arm being driveable by a gripper arm drive away from and towards the reticle rack.

17. The method of claim 16 further comprising providing the robot with a vertical column to which the gripper arm is movably mounted, vertical movement of the gripper arm relative to the vertical column being provided by a vertical drive.

18. The method of claim 17 further comprising rotatably mounting the vertical column to a carriage, rotary motion of the vertical column being provided by a rotary drive.

19. The method of claim 18 further comprising driving the carriage alongside the reticle rack with a bottom drive.

20. The method of claim 16 further comprising determining with a vision system whether a slot in the reticle rack is occupied or empty, the position of the gripper relative to the slot, and whether the gripper is correctly gripping a reticle.

21. The method of claim 16 further comprising placing into and removing reticles from pods with the robot.

22. The method of claim 13 further comprising attaching a manual tool to the reticle rack for removing and replacing reticles with minimal particle generation.

23. The method of claim 13 further comprising providing a robot service location within the enclosure for servicing the robot, the robot service location capable of being isolated from the reticle rack to prevent contamination of the reticles during service of the robot.

* * * * *

UNITED STATES PATENT AND TRADEMARK OFFICE
CERTIFICATE OF CORRECTION

PATENT NO. : 6,690,993 B2  Page 1 of 1
DATED : February 10, 2004
INVENTOR(S) : Richard F. Foulke et al.

It is certified that error appears in the above-identified patent and that said Letters Patent is hereby corrected as shown below:

Column 13,
Line 17, delete "8" and insert -- 4 --.

Signed and Sealed this

First Day of February, 2005

JON W. DUDAS
*Director of the United States Patent and Trademark Office*